(12) United States Patent
Nowshadi et al.

(10) Patent No.: US 11,611,460 B2
(45) Date of Patent: Mar. 21, 2023

(54) CARRIER FREQUENCY ERROR ESTIMATOR WITH BANKED CORRELATORS

(71) Applicant: SAMSUNG ELECTRONICS CO., LTD., Suwon-si (KR)

(72) Inventors: Farshid Nowshadi, Cambridge (GB); Jacob C Sharpe, Cambridge (GB)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/181,391

(22) Filed: Feb. 22, 2021

(65) Prior Publication Data

US 2022/0094578 A1  Mar. 24, 2022

Related U.S. Application Data

(60) Provisional application No. 63/081,519, filed on Sep. 22, 2020.

(51) Int. Cl.
| H04L 27/00 | (2006.01) |
| H03M 1/08 | (2006.01) |
| H03M 1/06 | (2006.01) |

(52) U.S. Cl.
CPC ...... *H04L 27/0014* (2013.01); *H03M 1/0675* (2013.01); *H03M 1/0836* (2013.01); *H04L 2027/0065* (2013.01)

(58) Field of Classification Search
CPC ........ H04L 27/0014; H04L 2027/0065; H03M 1/0675; H03M 1/0836

USPC .......................................................... 375/326
See application file for complete search history.

(56) References Cited

U.S. PATENT DOCUMENTS

| 6,072,786 A | * | 6/2000 | Wang .............. H04B 7/18532 |
| | | | 455/12.1 |
| 7,965,799 B2 | | 6/2011 | Rao et al. |
| 8,014,379 B2 | | 9/2011 | Capretta et al. |
| 8,824,606 B2 | | 9/2014 | Cheng et al. |
| 9,054,790 B2 | | 6/2015 | McLaughlin et al. |
| 9,853,787 B2 | | 12/2017 | Stanciu et al. |
| 10,079,705 B1 | * | 9/2018 | Sharpe ................. H04W 28/14 |
| 10,187,235 B2 | | 1/2019 | Zhang |
| 10,623,121 B1 | * | 4/2020 | Satrasala .............. H04W 24/08 |
| 2017/0195152 A1 | * | 7/2017 | Chu ..................... H04L 27/156 |
| 2018/0234358 A1 | | 8/2018 | Jakubov et al. |
| 2019/0028316 A1 | * | 1/2019 | Chu .................... H04L 27/2663 |

* cited by examiner

*Primary Examiner* — Kevin M Burd
(74) *Attorney, Agent, or Firm* — F. Chau & Associates, LLC

(57) ABSTRACT

An apparatus and method for carrier frequency estimation include a carrier frequency estimator having: a frequency input terminal disposed to receive a frequency-domain input signal comprising a plurality of symbols; a plurality of candidate pipelines, each comprising a frequency adder coupled to the frequency input terminal, a bit converter coupled to the frequency adder, a multi-bit buffer coupled to the bit converter; and a correlator coupled to the multi-bit buffer, respectively; and a candidate pipeline selector coupled to the correlators.

20 Claims, 15 Drawing Sheets

CARRIER FREQUENCY ERROR ESTIMATOR WITH BANKED CORRELATORS

CROSS-REFERENCE

This application claims priority under 35 U.S.C. § 119 to U.S. Provisional Application No. 63/081,519 entitled BLUETOOTH CARRIER FREQUENCY ERROR ESTIMATION USING BANK OF SIMPLE CORRELATORS and filed in the United States Patent and Trademark Office on Sep. 22, 2020, the disclosure of which is incorporated by reference herein in its entirety.

TECHNICAL FIELD

Embodiments of the present disclosure relate to wireless communications, and more particularly relate to carrier frequency error estimation using banked correlators.

DISCUSSION OF RELATED ART

Wireless communications generally use synchronization at a receiver for accurate decoding. Bluetooth® is a family of wireless radio communications technologies based on the Institute of Electrical and Electronics Engineers (IEEE) 802.15.1 standard. Although the IEEE no longer maintains the Bluetooth® standard, Bluetooth® is actively managed by the Bluetooth® Special Interest Group (SIG).

Bluetooth® radio packet formats, such as Bluetooth® Classic and Bluetooth® Low Energy (LE), have a relatively short preamble. In Bluetooth® LE, the preamble is eight bits followed by the device's Access Address, the first bit of which is always different from the last bit of the preamble. In Bluetooth® Classic, also referred to as Bluetooth® Basic Rate/Enhanced Data Rate (BR/EDR), the preamble is four bits followed by the device's Sync Word, the first bit of which is always different from the last bit of the preamble. The Access Address or Sync Word is generally used to establish three characteristics of the incoming packets: 1) Symbol Timing; 2) Carrier Frequency Error (or offset); and 3) Identification for the receiving device (e.g., that it has the correct Access Address or Sync Word).

In order to acquire and confirm the Access Address or Sync Word, accurate knowledge of the symbol timing and carrier frequency error are used. However, estimating one of symbol timing or carrier frequency error is difficult without knowledge of the other. Thus, the information being extracted from the Access Address or Sync Word is substantial, and may use a method of joint detection.

In Bluetooth® LE, for example, all 32 bits of the Access Address must be demodulated correctly because the Access Addresses may have just one bit different from that of another device. That is, inaccuracies in carrier frequency error estimation may lead to packet loss if even one bit is incorrectly demodulated. Receivers may struggle to receive packets with large carrier frequency errors, especially for packets with low signal-to-noise ratios (SNR). Where the radio frequency (RF) specification calls for tests using packets with large frequency errors, such errors may lead to degraded sensitivity.

SUMMARY

An exemplary embodiment carrier frequency estimator includes: a frequency input terminal disposed to receive a frequency-domain input signal comprising a plurality of symbols; a plurality of candidate pipelines, each comprising a frequency adder coupled to the frequency input terminal, a bit converter coupled to the frequency adder, a multi-bit buffer coupled to the bit converter; and a correlator coupled to the multi-bit buffer, respectively; and a candidate pipeline selector coupled to the correlators.

The estimator may be configured where each of the adders has a predefined frequency offset relative to an adjacent adder. The estimator may be configured where the plurality of candidate pipelines are arranged in parallel with each other. The estimator may be configured where each of the buffers is a first-in first-out (FIFO) buffer.

The estimator may be configured where each of the buffers has a bit length greater than or equal to a positive integer divisor of at least one of a pre-amble, a mid-amble, or a communications error correcting code (ECC) of the input signal. The estimator may be configured where each of the correlators is configured to correlate a plurality of bits, corresponding to at least one bit per symbol, with at least one of a pre-amble, a mid-amble, or a communications error-correcting code of the input signal. The estimator may be configured with the selector disposed to select one of the plurality of candidate pipelines having a greatest correlation.

An exemplary embodiment method of carrier frequency estimation includes: receiving a frequency-domain input signal comprising a plurality of symbols; splitting the received signal into a plurality of streams; adding a different candidate frequency error to each stream; converting each stream into a respective plurality of bits; storing the bits into a buffer at an integer multiple of the symbol rate; selecting a plurality of bits corresponding to at least one bit per symbol from each buffer for each respective stream; correlating the bits of each stream with a reference code; and selecting one of the plurality of streams having the greatest correlation as a basis for the carrier frequency estimation.

The method may further include: receiving in-phase/quadrature-valued input data; converting the in-phase/quadrature-valued input data into phase data; and converting the phase data into the frequency-domain input signal. The method may further include down-sampling the frequency-domain input signal. The method may further include adding a different candidate frequency error to each stream comprises adding substantially evenly spaced candidate frequency errors to the respective streams.

The method may be applied where adding a different candidate frequency error to each stream comprises adding unevenly spaced candidate frequency errors to the respective streams based on a probability distribution of expected carrier frequency differences between a transmitter and a receiver. The method may be applied where converting each stream into a respective plurality of bits comprises basing each bit decision on a sign of frequency. The method may be applied where: the buffer is a first-in first-out (FIFO) buffer storing four times the symbol rate; and the selected plurality of bits from each buffer for each respective stream is one quarter of the number of bits buffered therein, taking every fourth sample from the respective FIFO buffer for each respective stream.

An exemplary embodiment receiver includes: an input terminal configured to receive an input signal comprising a plurality of frequency-modulated data packets defining a plurality of symbols for a channel; an oscillator; a mixer connected to the input terminal and an output of the oscillator; an analog-to-digital converter (ADC) connected to the mixer; a second mixer connected to the input terminal and a second output of oscillator, wherein the second output is in quadrature with the first output of the oscillator; a second ADC connected to the second mixer; an in-phase/quadrature to phase converter connected to the first ADC and the second ADC; a phase to frequency converter connected to the in-phase/quadrature to phase converter; a plurality of candidate pipelines, each comprising a frequency adder coupled to the phase to frequency converter, a bit converter coupled to the frequency adder, a multi-bit buffer coupled to the bit converter; and a correlator coupled to the multi-bit buffer, respectively; and a candidate pipeline selector coupled to the correlators.

The receiver may include an amplifier connected between the input terminal and the mixers. The receiver may include: a first filter connected between the first ADC and the in-phase/quadrature to phase converter; and a second filter connected between the second ADC and the in-phase/quadrature to phase converter. The receiver may include a down-sampler connected between the phase to frequency converter and the plurality of candidate pipelines.

The receiver may have the plurality of candidate pipelines arranged in parallel with each other. The receiver may include a multiplexer and/or demultiplexer (Mux/Demux) connected between the phase to frequency converter and an input terminal of the plurality of candidate pipelines, wherein the Mux/Demux is configured to switchably share at least some of the plurality of candidate pipelines with another channel, and/or to temporarily bypass at least some of the plurality of candidate pipelines for the first channel.

BRIEF DESCRIPTION OF THE DRAWINGS

Embodiments of the present disclosure may become more apparent and be better appreciated upon consideration of the following description of exemplary embodiments when taken in conjunction with the accompanying drawings, in which.

DETAILED DESCRIPTION

Exemplary embodiments of the present disclosure provide a method and apparatus for estimating the extent of carrier frequency error using banked correlators in a wireless channel, such as in, but not limited to, a Bluetooth® Low Energy (LE) and/or a Bluetooth® Classic (BR/EDR) wireless communications channel.

A method embodiment for carrier frequency error estimation tests a plurality of carrier frequency offset candidates based on at least a portion of the preamble. It correlates the received bit stream to the known preamble pattern to estimate the best matching frequency error or offset. As the carrier frequency error is not known in advance, it runs a bank of simultaneous correlators, each of which has been corrected by a different frequency error candidate. The candidate frequency error that correlates with the preamble is then selected. An implementation size of 1-bit correlators is just 1 bit each. Thus, the gate count as implemented is relatively small. Exemplary embodiments preferably perform correlations on the preamble in the frequency domain and/or bit domain, rather than in the In-phase/Quadrature (I/Q) domain.

For example, carrier frequency error may be present because the receiving device has a different crystal for its frequency reference than that of the transmitter. That is, the local oscillator frequencies might not match. Any crystal will have a design tolerance on its frequency accuracy, where the tolerance is typically larger for less expensive crystals. Wireless radios and the like may be designed and/or implemented to have a relatively low impact on costs. Thus, some current standards may permit a crystal accuracy of ±50 ppm. This equates to ±150 kHz of carrier frequency error for devices operating in the 2.4 GHz radio frequency (RF) spectrum. As the receiving device's crystal may also have a frequency error of the opposite sign, carrier frequency errors of 250 kHz, or potentially up to 300 kHz even with two properly operating devices, may be expected. Gaussian pulse shaping of a 10101010 sequence would have a deviation of ±220 kHz, so the carrier frequency errors may be a substantial fraction of the Gaussian Frequency Shift Keying (GFSK) modulation frequency deviation.

One approach to the joint detection problem relies upon making a good estimate of the carrier frequency error in order to ease the estimation of the symbol timing and demodulation of the Access Address or Sync Word. Such estimation may be either expensive, such as in terms of the number of transistor gates used, or inaccurate, particularly for low signal-to-noise ratio (SNR) communications.

Figure 1:
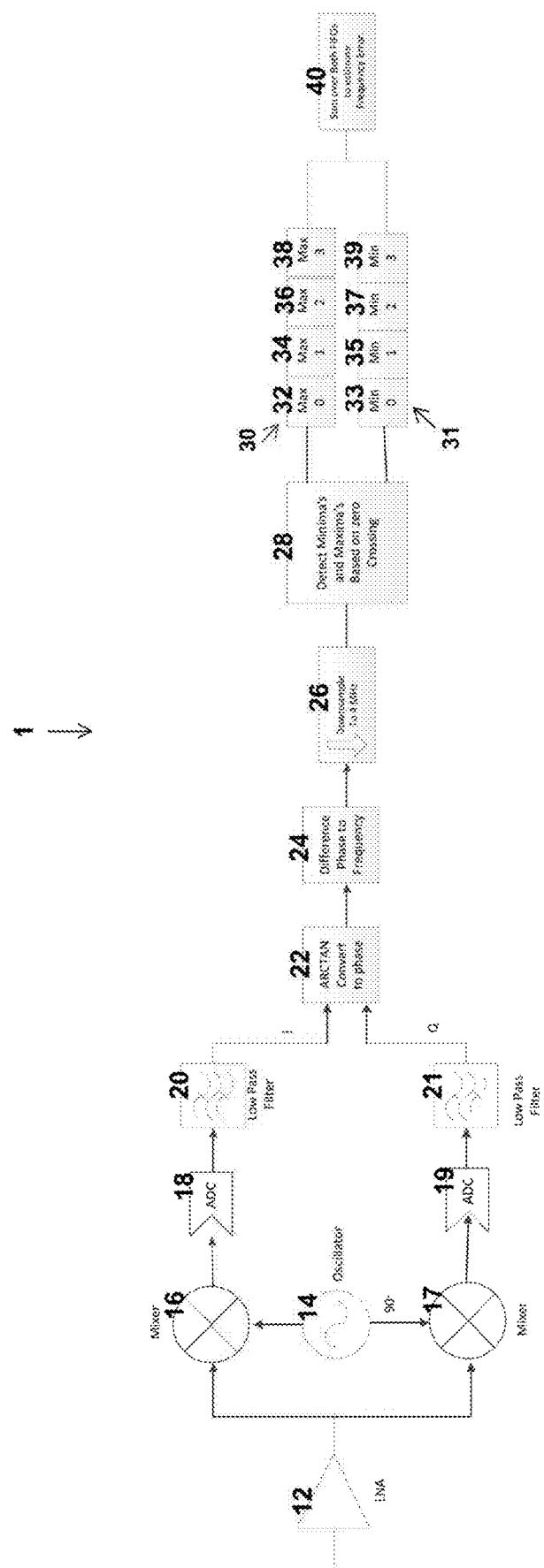
FIG. 1 is a schematic block diagram illustrating an In-phase Quadrature (I/Q) receiver with minima/maxima zero-crossing detector.

As shown in FIG. 1, an In-phase Quadrature (I/Q) receiver is indicated generally by the reference numeral 1. The I/Q receiver 1 includes a low-noise amplifier (LNA) 12 connected to a first mixer 16 and a second mixer 17, an oscillator 14 that provides a first signal to the first mixer 16 and a second signal, 90 degrees out of phase with the first signal, to the second mixer 17, a first analog-to-digital converter (ADC) 18 connected to the first mixer, and a second ADC connected to the second mixer, a first low-pass filter 20 connected to the first ADC and a second low-pass filter 21 connected to the second ADC, an ARCTAN to phase converter 22 connected to the first and second low-pass filters, a difference phase to frequency converter 24 connected to the ARCTAN to phase converter 22, a 4 MHz down-sampler 26 connected to the difference phase to frequency converter, a detector 28 connected to the down-sampler to detect minima and maxima based on zero crossings, a pair of first-in first-out (FIFO) buffers 30 and 31 to store the detected maxima and minima, respectively, and an estimator 40 connected to the FIFO buffers that sums over both FIFO buffers to estimate frequency error. Here, the maxima FIFO buffer 30 includes four multi-bit digital samples: 32, 34, 36 and 38, respectively. Similarly, the minima FIFO buffer 31 includes four multi-bit digital samples: 33, 35, 37 and 39, respectively.

The receiver 1 uses a direct conversion receiver architecture, although it is not limited to this type of architecture. For example, a super-heterodyne type of receiver or the like may be used in alternate embodiments. At the LNA 12, the signal is received in the 2.4-2.48 GHz Industrial, Scientific and Medical (ISM) band, which is amplified, mixed, and sampled. The signal is digitized and at least low-pass filtered using a filter having sufficiently wide bandwidth, here 1.3 MHz, to allow passage of the Bluetooth® Low Energy (LE) or Long-Range signal including any frequency offset prior to down-sampling. Thus, the receiver operates on the buffered I/O data, down-sampled here to 4 million samples per second (MSample/s).

A carrier frequency estimator may include a simple min-max detector, and use a zero-frequency crossing to separate the maxima and minima. A fixed number of maxima and minima may be stored in a buffer, such as four of each, and the carrier frequency error may be computed as the average value over both buffers. Here, the maxima and minima may be determined by a zero-crossing detection.

Figure 2:
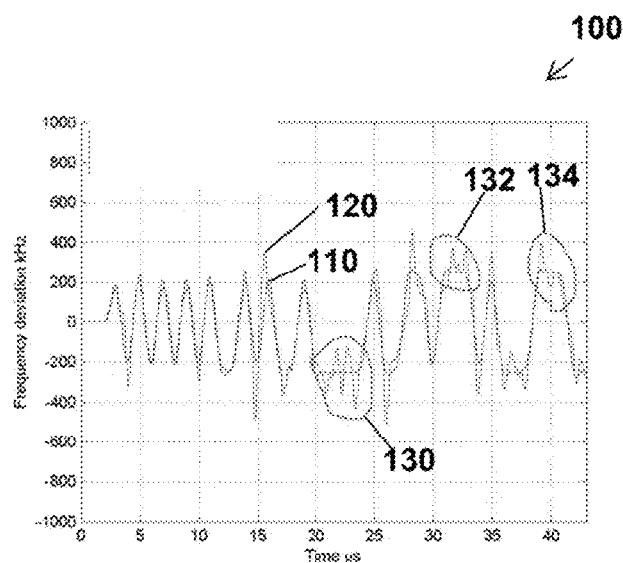
FIG. 2 is a graphical diagram illustrating frequency-modulated (FM) demodulation of preamble and access address with no carrier frequency error or drift.
Figure 3:
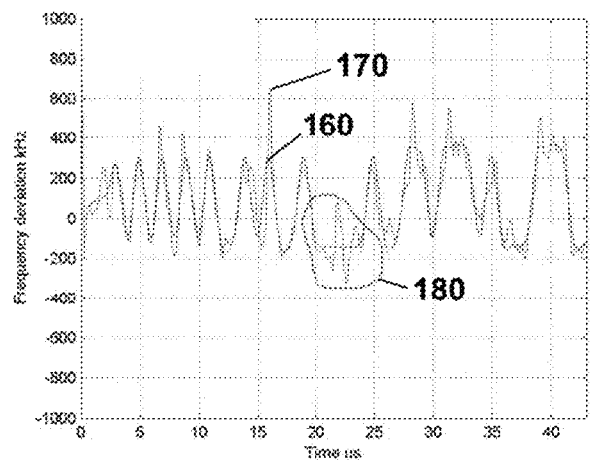
FIG. 3 is a graphical diagram illustrating FM demodulation of preamble and access address with carrier frequency error and drift.

The plots in FIG. 2 and FIG. 3 illustrate the frequency-modulation (FM) demodulation of the preamble (8 bits or effectively 9 bits for LE, 4 bits or effectively 5 bits for BR/EDR) and the access address, the first bit of which is necessarily opposite to the last bit of the preamble and may therefore be considered a last bit of the preamble, of a Bluetooth® LE packet on which the estimator might operate.

Turning to FIG. 2, a graphical representation of frequency deviation versus time is indicated generally by the reference numeral 100, and illustrates a result from a carrier frequency estimator that includes a simple min-max detector for a packet with no carrier frequency error or drift. Frequency deviation (in kHz) versus time (in µs) is shown for an ideal signal-to-noise ratio (SNR) plot 110 and for a 15 dB SNR plot 120.

Turning now to FIG. 3, a graphical representation of frequency deviation versus time is indicated generally by the reference numeral 150, and illustrates a result from the carrier frequency estimator that includes the simple min-max detector for a packet with carrier frequency error and drift. Frequency deviation (in kHz) versus time (in µsec) is shown for an ideal signal-to-noise ratio (SNR) plot 160 and for a 15 dB SNR plot 170.

In the plot of FIG. 2, the circled peaks 130, 132 and 134 are each easily identified as a single peak using the simple zero-crossing algorithm. However, in the plot of FIG. 3 with a relatively larger, but not atypical, carrier frequency error, an extended set of zeroes 180 is circled where the algorithm may struggle with noise-induced zero-crossings that would not otherwise be present.

Although the above-described algorithm is relatively simple to implement, the reliance on zero-crossings means that the detection becomes progressively worse with increasing frequency error.

An option might be to try to identify the maxima and minima locally without regard to zero crossings. Implementation of this methodology resulted in a considerable increase in circuit size, yet struggled to accurately identify the maxima and minima in the presence of noise. This is illustrated by the circled sequences in FIGS. 2 and 3, each of which should be a single peak but could potentially be resolved into separate maxima and minima.

Another option might be to make greater use of the preamble in an I/O or Cartesian correlation, but this, too, has its challenges. The preamble may be relatively short (e.g., 8 µsec for Bluetooth® LE), but the carrier frequency errors may be relatively large. Thus, considerable serial processing might be insufficient. Additionally, a use of the preamble is to activate Automatic Gain Control (AGC) on the receiver. During these instances, there may be gain changes that affect the magnitudes of correlation peaks. Thus, the implementation costs for such an approach might yield a disproportionately marginal performance gain.

Other approaches may consider the received bit stream and either estimate the carrier frequency error through the integration of phase over a series of bits that have no net frequency deviation, such as, for example, 101010, 111000, 011001 and the like (that is, an equal number of 1's and 0's), or subtract the phase from the predicted bits of the integration.

Other estimation approaches on the preamble are possible. One is a simple integration of the phase to get the frequency error. This uses a systematic pattern of 1 and 0's. Thus, while the estimate is good at the end of the preamble, it is then likely to drift. The method may be extended to only look at series of bits that have no net frequency deviation (e.g., 101010, 111000, or the like) or subtract the phase of the predicted bits from the integration. Such methods may falter from their lack of knowledge of the symbol time and transmit modulation index.

Another approach is to attempt packet detection on the preamble, such as by some form of correlation on the preamble or a part thereof. Once packet detection is achieved and knowledge of the symbol timing has been obtained, then an estimate of the carrier frequency error might be made using the preamble by using some property of the repeating 1010 (Bluetooth® Basic Rate/EDR) or 10101010 (Bluetooth® LE) bit pattern. A challenge is that the preambles are too short to support efficient packet detection methods. That was not their role in the standard, where they merely allow automatic gain control (AGC) to settle and a rough frequency estimate to be performed. The short length of the preamble may complicate the setting of an appropriate threshold for correlation.

Figure 4:
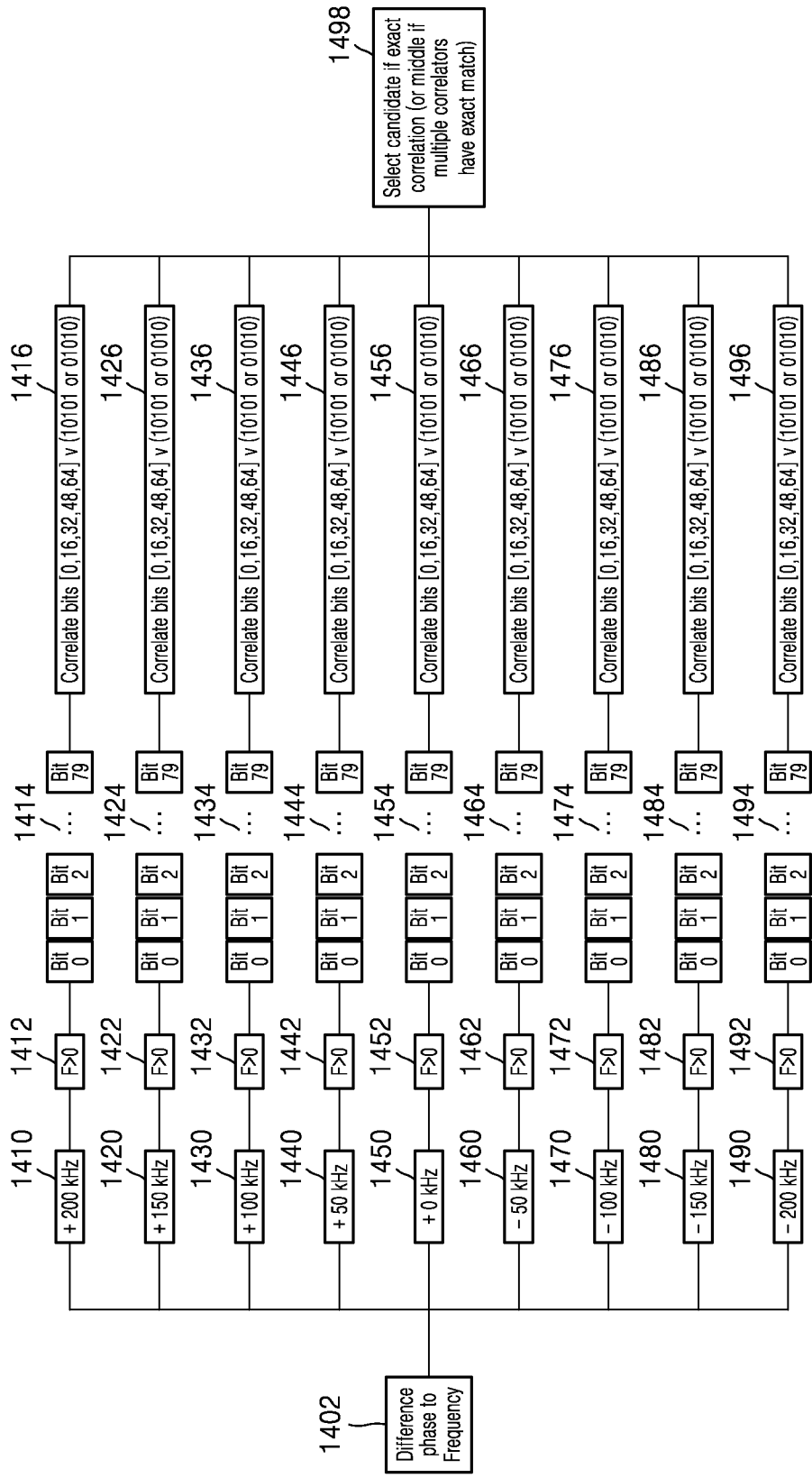
FIG. 4 is a schematic block diagram illustrating a carrier frequency error estimator at 16 times symbol rate for 5-bit preambles including a bank of correlators in accordance with an exemplary embodiment of the present disclosure.

As shown in FIG. 4, an exemplary embodiment carrier frequency error estimator including a bank of correlators is indicated generally by the reference numeral 1400. The estimator 1400 may use information from the Preamble and the first bit of the Access Address, without limitation. This embodiment may successfully demodulate a packet where a portion of the preamble is transmitted with a large frequency offset compared to the first bit of the Access Address and the rest of the packet.

The estimator 1400 includes a difference phase to frequency converter 1402 connected to multiple parallel correlators. Each of the parallel correlators may include a respective adder (1410 to add 200 kHz, 1420 to add 150 kHz, 1430 to add 100 kHz, 1440 to add 50 kHz, 1450 to add 0 kHz (or it may be omitted), 1460 to subtract 50 kHz, 1470 to subtract 100 kHz, 1480 to subtract 150 kHz, and 1490 to subtract 200 kHz) for each respective frequency error candidate, a respective comparator (1412, 1422, 1432, 1442, 1452, 1462, 1472, 1482, and 1492) connected to the adder to convert the signal to bits by determining if the resultant frequency is greater than zero, a respective first-in first-out (FIFO) buffer (1414, 1424, 1434, 1444, 1454, 1464, 1474, 1484, and 1494) each buffering 64 bits in this example, but not limited thereto, and a respective correlator (1416, 1426, 1436, 1446, 1456, 1466, 1476, 1486, and 1496) to correlate bits (0, 16, 32, 48, 64) versus the first 5 bits of the preamble, such as 10101 or 01010, without limitation thereto. A selector 1498 is connected to the multiple parallel correlators, and may be configured to select the candidate with the best correlation, or a middle correlator of multiple correlators that have a best correlation of the frequency error candidates. If the bit pattern of the preamble is matched, the frequency error of that correlator may be used for the address check.

Figure 5:
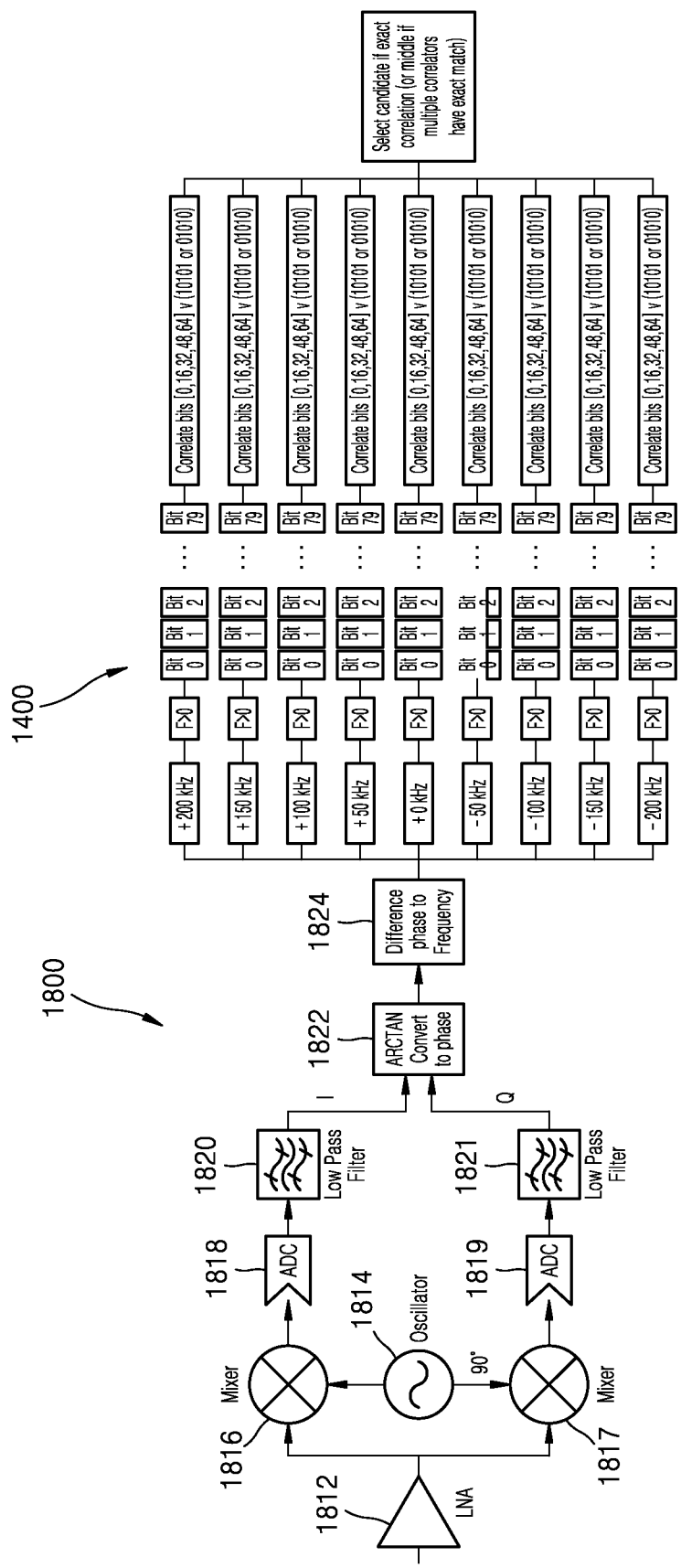
FIG. 5 is a schematic block diagram illustrating an In-phase Quadrature (I/Q) receiver including the carrier frequency error estimator of FIG. 4 in accordance with an exemplary embodiment of the present disclosure.

Turning to FIG. 5, an In-phase Quadrature (I/Q) receiver including the carrier frequency error estimator 1400 with banked correlators is indicated generally by the reference numeral 1800. The receiver 1800 includes a low-noise amplifier (LNA) 1812 connected to a first mixer 1816 and a second mixer 1817, an oscillator 1814 that provides a first signal to the first mixer 1816 and a second signal, 90 degrees out of phase with the first signal, to the second mixer 1817, a first analog-to-digital converter (ADC) 1818 connected to the first mixer, and a second ADC connected to the second mixer, a first low-pass filter 1820 connected to the first ADC and a second low-pass filter 1821 connected to the second ADC, an ARCTAN to phase converter 1822 connected to the first and second low-pass filters, a difference phase to frequency converter 1824 (comparable to the converter 1402, but not limited thereto) connected to the ARCTAN to phase converter 1822, a 4 MHz down-sampler 1826 connected to the difference phase to frequency converter, as well as the parallel correlators and selector of the estimator 1400 connected to the down-sampler 1826, where duplicate description may be omitted.

The receiver 1800 is capable of implementing the techniques of the present disclosure without unnecessary compromises in cost, size, or accuracy. This is a generic direct conversion receiver, although the present disclosure is not limited to that architecture. At the LNA, the exemplary signal is received in the 2.4-2.48 GHz industrial, scientific and medical (ISM) band. This signal is amplified and down-converted. The signal is then digitised and low-pass filtered by a filter wide enough (typically 1.3 MHz) to allow through the signal including any carrier frequency offset. It may be assumed that the received signal is mixed at the nominal channel frequency of the transmission. In practice, this might be achieved over two mixing process, such as a first mixing to an intermediate frequency (IF), and a second mixing to down-convert to a baseband frequency, which may potentially be performed in the digital domain. Thus, the right-hand side shows processing particularly pertinent to the disclosure, and further details are given below.

Figure 6:
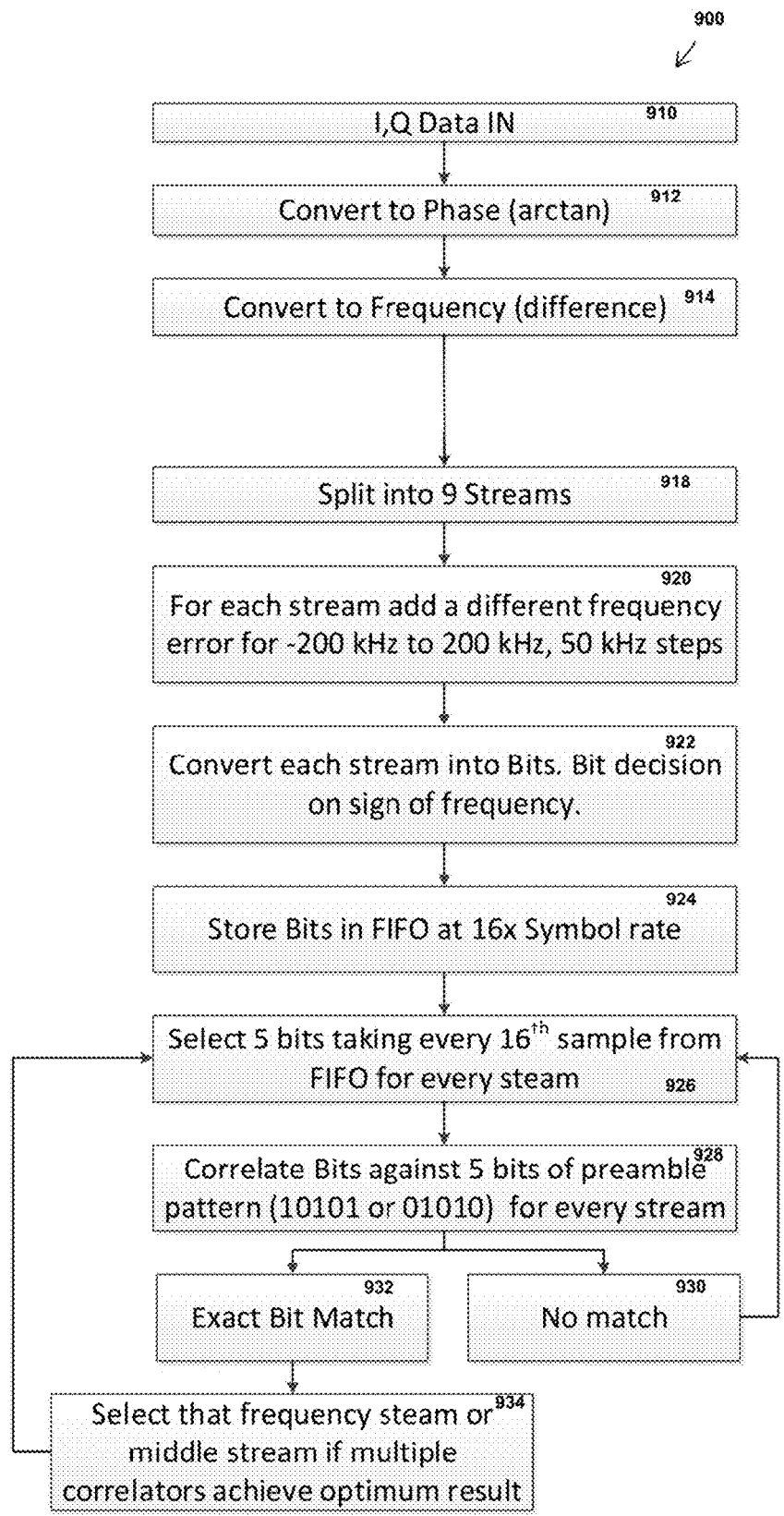
FIG. 6 is a flowchart diagram illustrating a method of frequency stream selection in accordance with the receiver of FIG. 5.

Turning now to FIG. 6, an exemplary embodiment processing flow for a carrier frequency error estimation method is indicated generally by the reference numeral 900. Here, function block 910 receives in-phase (I) and quadrature (Q) valued input data (in-phase/quadrature or I,Q paired data), and passes control to function block 912. Block 912 converts the I,Q paired data into phase data by using an arctangent function, and passes control to function block 914. Block 914 converts to frequency data by using a difference function, and passes control to function block 918. Block 918, in turn, splits the signal into nine streams, and passes control to function block 920.

Block 920 adds a different potential frequency error to each stream, from −200 kHz to +200 kHz, in 50 kHz increments, and passes control to function block 922. Block 922 converts each stream into bits, such as by making a simple bit decision based on the sign of the frequency, and passes control to function block 924. Block 924 stores the bits in the FIFO buffer at sixteen times (16×) the symbol rate, and passes control to function block 926.

Block 926, in turn, selects 5 bits for Bluetooth® BR/EDR (or 5 to 9 bits for Bluetooth® LE), taking every sixteenth sample from the respective FIFO buffer for each stream, and passes control to function block 928. Block 928 correlates the bits against the Preamble for every stream. If no correlation exceeds the threshold, block 928 passes control through block 930 back to block 926. If any correlation exceeds the threshold, block 928 passes control through block 932 on to function block 934. Block 934, in turn, selects that highest correlated frequency stream, or a middle stream of multiple correlators that achieve an optimum result.

Thus, the I,Q paired data samples are converted to phase, and this phase is then differenced to give a frequency by FM demodulation. At this point, the processing becomes parallel as nine carrier frequency error candidates, without limitation thereto, are processed in parallel. For each of the nine streams, a different frequency error is added. In this embodiment, a granularity of 50 kHz is used, without limitation thereto, giving nine streams. Other choices are possible; such as more streams and a finer resolution or fewer streams at the expense of a coarser resolution, either of which may be used to reach performance objectives for a given application. The FM demodulation is then converted into bits. This may be done by simply assigning a 1 bit if the frequency is greater than zero, or a 0 bit if the frequency is less than zero. This data is then buffered in a FIFO, which is compared against the Preamble.

The data in this embodiment is sixteen times oversampled, so every sixteenth sample is compared against the Preamble. For Bluetooth® LE, such as at a 2 Mbit/s data rate, an exact match is sought with no bit errors. If one or more of the stream's correlators achieve this, then sync has been achieved. If multiple correlators show this result, then the middle correlator of these in terms of the carrier frequency error will be selected. In the case of an even number of correlators achieving the result, then the lowest carrier frequency offset of the middle pair is selected. Finally, the selected stream is also used to derive the symbol timings for use by the demodulator. The three aspects of synchronization are therefore performed for the incoming packet, namely: 1) Preamble check, 2) carrier frequency estimation, and 3) symbol timing recovery.

The procedure is directly applicable to Bluetooth® Classic (BR as well as EDR since EDR packets have a BR header using all 5 bits of its effective 5-bit preamble, and may be applied to LE using 5 or more bits of its 9-bit effective preamble). Using a greater number of bits may provide greater accuracy and reliability with the trade-offs of greater minimum FIFO buffer length and correlator complexity. Thus, the FIFO buffer may be extended, such as to store 256 bits for each stream, for example, or reduced to save circuit area and/or power consumption such as to store 5 bits for each stream. The algorithm searches for a correlation with no bit errors or alternatively the fewest bit errors. Similarly, if an optimum result is achieved across multiple correlators, the middle such correlator is selected.

Optimized performance may be achieved for varied design constraints by embodiments of the present disclosure. An alternate embodiment of the present disclosure may be embodied in a radio frequency (RF) die, such as a WiFi™/Bluetooth® combination system-on-chip (SoC) architecture, an Internet of Things (IoT) connectivity SoC, or the like.

The pattern of 10101 or 01010 is a short 5-bit pattern that was chosen as it allows the same embodiment to be used substantially unchanged for either Bluetooth® BR/EDR or Bluetooth® LE (BLE). Bluetooth® BR/EDR has only a 4-bit preamble, versus the 8-bit preamble of BR/EDR, but the first bit of the Sync Word is always the opposite of the last bit of the preamble, allowing the use of this 5-bit pattern. The data in this embodiment is 16 times oversampled, so every 16th sample is compared against the pattern. For BLE (including 2 Mbps), an exact match is desired. If one or more of the stream's correlators achieve this, then sync has been achieved and that carrier frequency error is selected. This carrier frequency error will then be used until another exact bit match is found. This updating of the frequency error for every exact match has the desired property that the carrier frequency estimate cannot get latched to a bad value as can happen in min/max schemes before any RF signal arrives. If the bit pattern occurs again in the Access Address or Sync Word, then the carrier frequency estimate may be updated again during the demodulation of the Access Address or Sync Word. Although this could be prevented with additional logic, for example, it is benign since the correlators will estimate substantially the same carrier frequency error as already in use, based on the preamble, from the second bit pattern match so the Access Address check and the like would be unaffected.

As illustrated, this exemplary embodiment without a pre-correlation down-sampler uses 16 samples per symbol. There are many choices for this number, and it may be more efficiently implemented with negligible performance loss at 8 or 4 samples per symbol. Accordingly, a pre-correlation down-sampler is optional but preferred.

Figure 7:
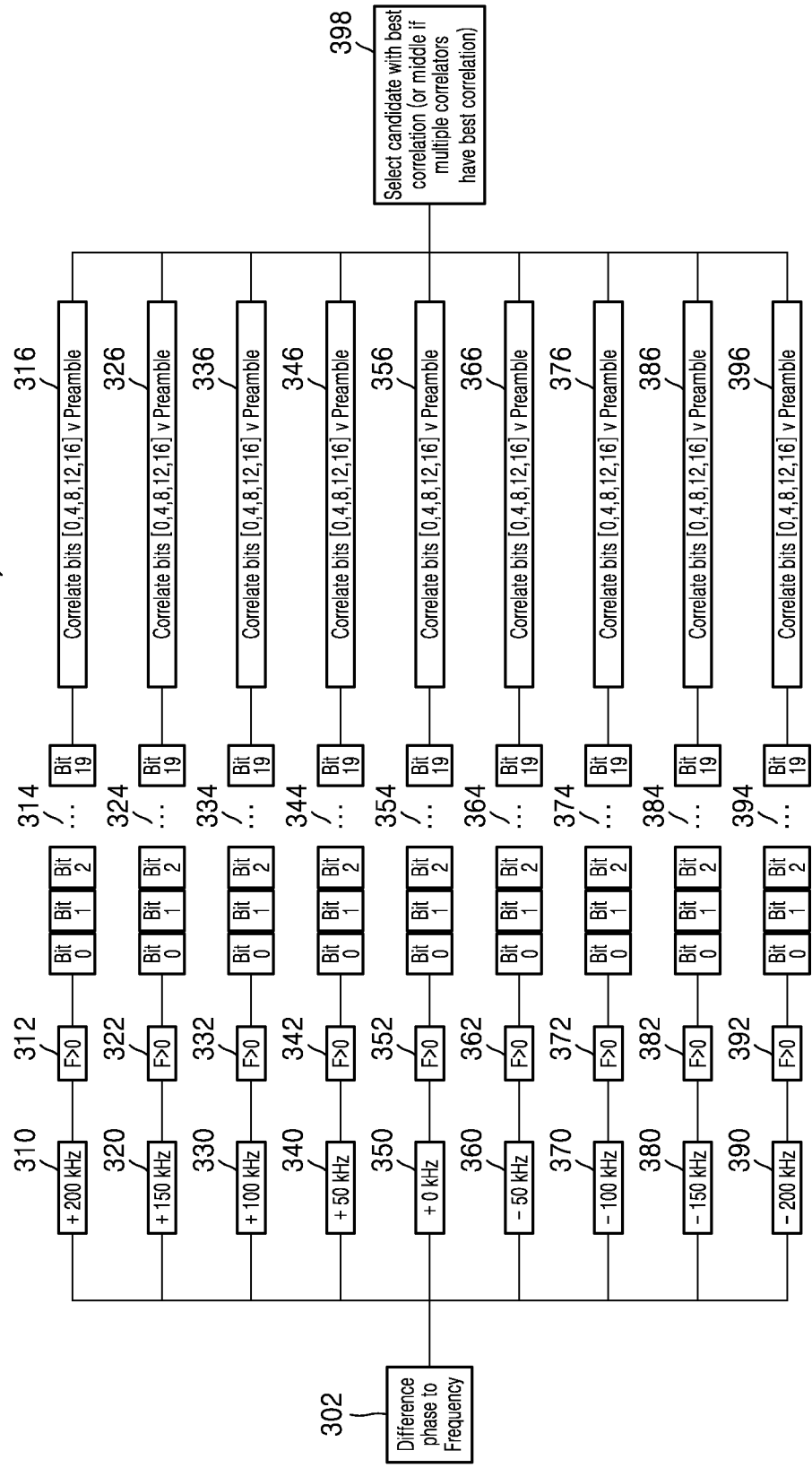
FIG. 7 is a schematic block diagram illustrating a carrier frequency error estimator at 4 times symbol rate for 5-bit preambles including a bank of correlators in accordance with an exemplary embodiment of the present disclosure.

Turning to FIG. 7, an exemplary embodiment carrier frequency error estimator including a bank of correlators is indicated generally by the reference numeral 300. The estimator 300 may use information from the Preamble and the first bit of the Access Address, without limitation. This embodiment may successfully demodulate a packet where a portion of the preamble is transmitted with a large frequency offset compared to the first bit of the Access Address and the rest of the packet.

The estimator 300 includes a difference phase to frequency converter 302 connected to multiple parallel correlators. Each of the parallel correlators may include a respective adder (310 to add 200 kHz, 320 to add 150 kHz, 330 to add 100 kHz, 340 to add 50 kHz, 350 to add 0 kHz (or it may be omitted), 360 to subtract 50 kHz, 370 to subtract 100 kHz, 380 to subtract 150 kHz, and 390 to subtract 200 kHz) for each respective frequency error candidate, a respective comparator (312, 322, 332, 342, 352, 362, 372, 382, and 392) connected to the adder to convert the signal to bits by determining if the resultant frequency is greater than zero, a respective first-in first-out (FIFO) buffer (314, 324, 334, 344, 354, 364, 374, 384, and 394) each buffering 20 bits in this example, but not limited thereto, and a respective correlator (316, 326, 336, 346, 356, 366, 376, 386, and 396) to correlate bits (0-3, 4-7, 8-11, 12-15 and 16-19) versus the preamble, without limitation thereto. The minimum or enabled FIFO size may be determined by Equation 1:

$$\text{FIFO\_bit\_length} = (\text{preamble\_length})(\text{oversampling\_rate}) \quad \text{(EQN. 1)}$$

Thus, a 4× over-sampled 5-bit preamble as the reference would use a FIFO buffer that is at least (5*4)=20 bits long. At each correlator, all of the bits of the correlator may be read out on every clock cycle. For example, when searching for a 5-bit preamble of 10101 in a 4× over-sampled signal with 20-bit long FIFO buffers, the reference pattern searched for each buffer may be 11110000111100001111. In some embodiments, rather than wait for an exact bit match of this pattern, the check may determine whether the match exceeds a threshold number of matching bits, such as 19 out of 20, without limitation thereto. A selector 398 is connected to the multiple parallel correlators, and may be configured to select the candidate with the best correlation, or a middle correlator if multiple correlators have a best correlation of the frequency error candidates.

Figure 8:
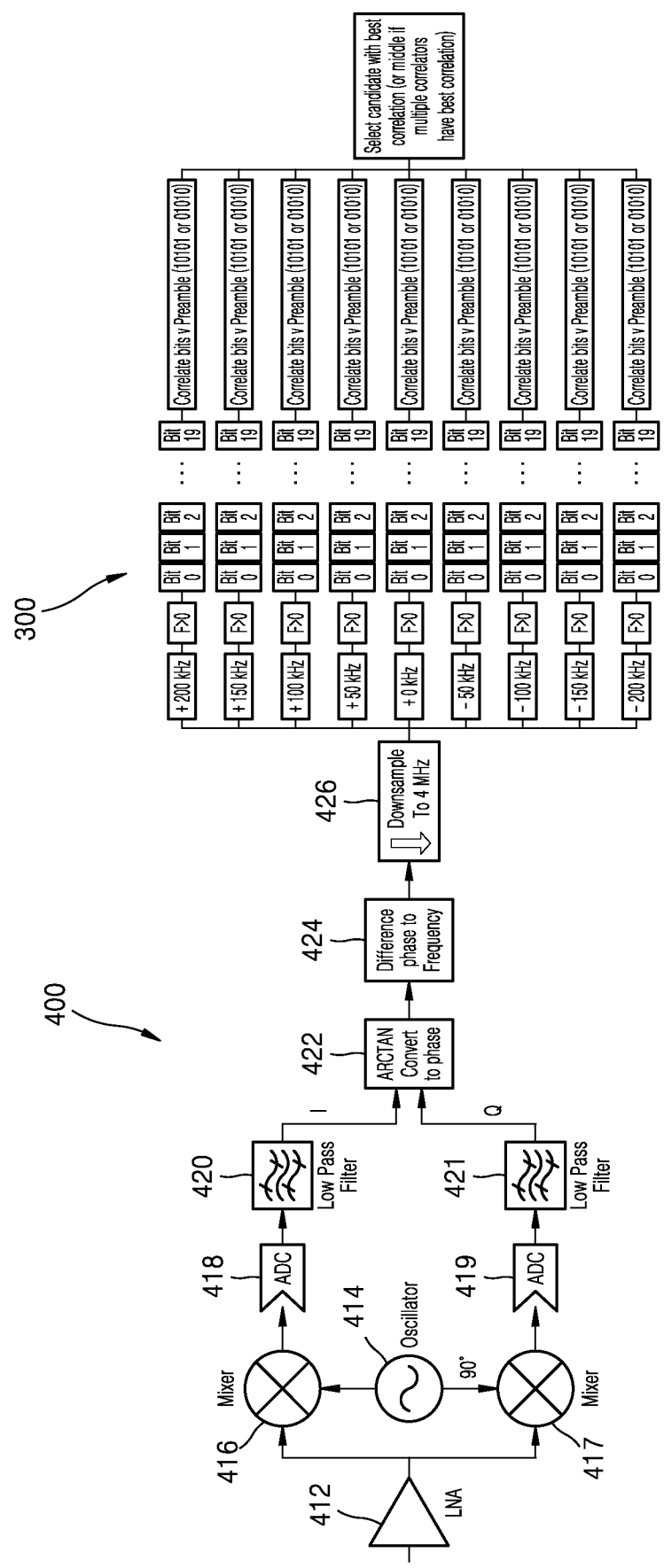
FIG. 8 is a schematic block diagram illustrating an In-phase Quadrature (I/Q) receiver including the carrier frequency error estimator of FIG. 7 in accordance with an exemplary embodiment of the present disclosure.

As shown in FIG. 8, an In-phase Quadrature (I/Q) receiver including the carrier frequency error estimator 300 with banked correlators is indicated generally by the reference numeral 400. The receiver 400 includes a low-noise amplifier (LNA) 412 connected to a first mixer 416 and a second mixer 417, an oscillator 414 that provides a first signal to the first mixer 416 and a second signal, 90 degrees out of phase with the first signal, to the second mixer 417, a first analog-to-digital converter (ADC) 418 connected to the first mixer, and a second ADC connected to the second mixer, a first low-pass filter 420 connected to the first ADC and a second low-pass filter 421 connected to the second ADC, an ARCTAN to phase converter 422 connected to the first and second low-pass filters, a difference phase to frequency converter 424 (comparable to the converter 302, but not limited thereto) connected to the ARCTAN to phase converter 422, a 4 MHz down-sampler 426 connected to the difference phase to frequency converter, as well as the parallel correlators and selector of the estimator 300 connected to the down-sampler 426, where duplicate description may be omitted.

The receiver 400 is capable of implementing the techniques of the present disclosure without unnecessary compromises in cost, size, or accuracy. This is a generic direct conversion receiver, although the present disclosure is not limited to that architecture. At the LNA, the exemplary signal is received in the 2.4-2.48 GHz industrial, scientific and medical (ISM) band. This signal is amplified and down-converted. The signal is then digitised and low-pass filtered by a filter wide enough (typically 1.3 MHz) to allow through the signal including any carrier frequency offset. It may be assumed that the received signal is mixed at the nominal channel frequency of the transmission. In practice, this might be achieved over two mixing process, such as a first mixing to an intermediate frequency (IF), and a second mixing to down-convert to a baseband frequency, which may potentially be performed in the digital domain. Thus, the right-hand side shows processing that is particularly pertinent to the disclosure.

Figure 9:
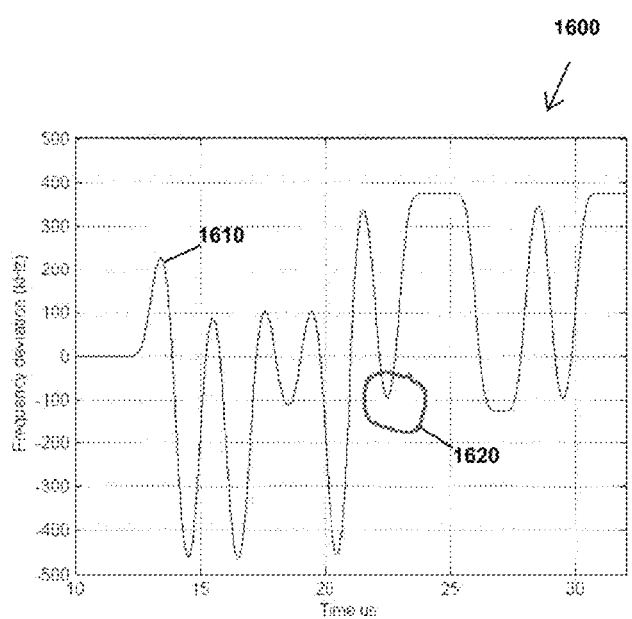
FIG. 9 is a graphical diagram illustrating a packet containing a modified preamble.

Turning now to FIG. 9, a graphical representation illustrating a packet containing a modified preamble is indicated generally by the reference numeral 1600. A modified preamble signal 1610 includes a positive frequency deviation of 300 kHz at a time point of about 21 us. As shown, a signal oscillation 1620, just after the deviation, falls short of reaching −100 kHz at its local minimum. The receiver 1 of FIG. 1 might not detect such a frequency deviation. However, exemplary embodiments of the present disclosure, such as the estimators 1400 and 300, as well as the exemplary embodiment receivers described herein, may reliably detect such frequency deviations.

Figure 10:
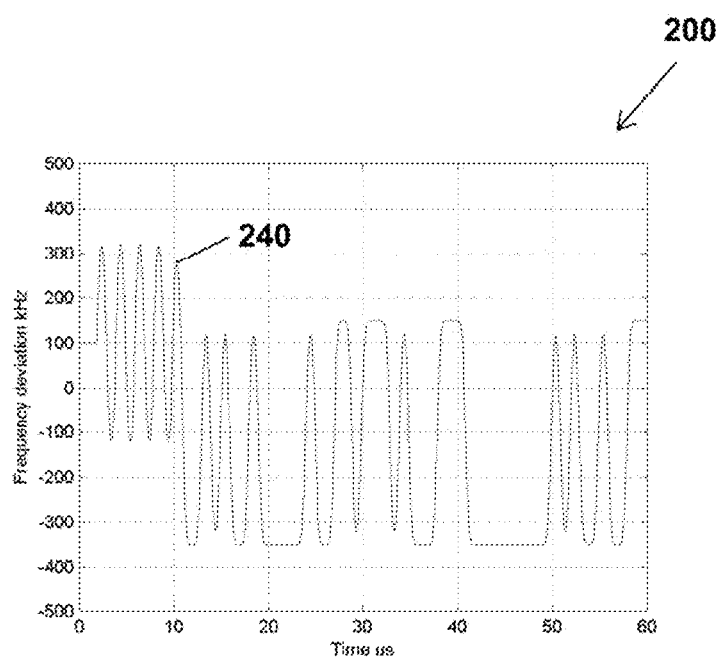
FIG. 10 is a graphical diagram illustrating a packet containing a preamble with an offset frequency error.

As shown in FIG. 10, a graphical representation of frequency deviation versus time is indicated generally by the reference numeral 200, and illustrates a result from a carrier frequency estimator, in accordance with an exemplary embodiment of the present disclosure, that includes banked correlators for a packet 240 containing a preamble with offset frequency error. The exemplary embodiment carrier frequency estimator utilizes the correlation of the received bit stream based on the preamble to check that the Access Address or Sync Word is correct, and determines the symbol being implemented with simple 1-bit correlators. Thus, an optimized approach to frequency estimation is to trial many carrier frequency offset candidates in parallel at this stage, such as with banked correlators, stage, and choose the best match. As the implementation size of these 1-bit correlators is small in terms of circuit area, this approach need not significantly increase circuit size or complexity.

While related art solutions aimed to make a good frequency estimation and feed a single correlator, exemplary embodiments of the present disclosure use multiple parallel correlators operating on the preamble, each set at a different frequency offset, to facilitate a single efficient search for a valid Access Address or Sync Word based on the frequency estimate of the parallel preamble correlators. The correlators, such as single-bit correlators, need not be expensive or take excessive circuit area to implement.

In correlators according to exemplary embodiments of the present disclosure, the frequency offset range may be increased quite simply by adding additional correlators. The correlators need not be more complex than efficient single-bit correlators, such as those optimized for gate count. In estimators incorporating banked correlators, robust and instantaneous detection may be achieved even in noisy environments. The technique may be applied to Bluetooth® LE at 1 Mbit/s data rate, Bluetooth® LE at 2 Mbit/s data rate, BDR and EDR technologies, without limitation thereto, and may be used to avoid implementation of expensive algorithms for frequency estimation for a relatively small increase in silicon area compared to related art peak detection techniques. For example, an electronic device with about 2 million gates in total used about 8 thousand gates for the related art estimator, and may use about 16 thousand gates for an estimator with banked correlators according to an exemplary embodiment of the present disclosure.

The preamble may be used for at least part of the frequency estimation. Even for a min/max scheme in the early part of the Access Address or Sync Word, the buffers may predominantly contain information from the preamble.

Figure 11:
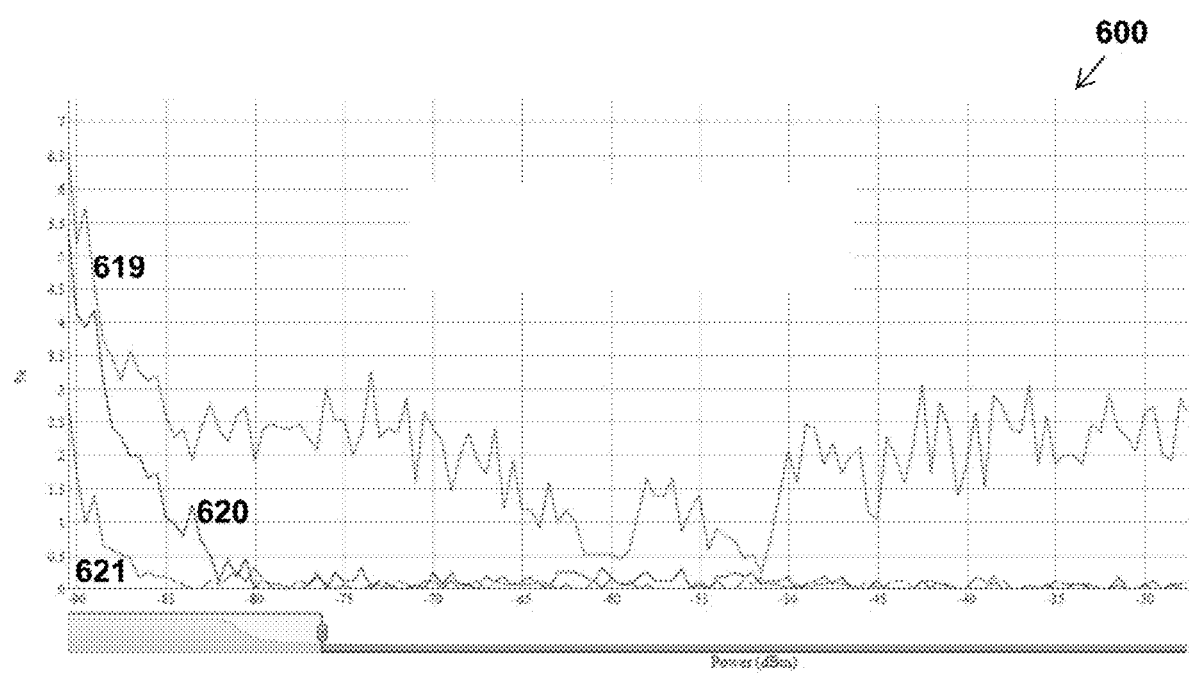
FIG. 11 is a graphical diagram illustrating percent error (PER) versus Power (dBm) plots for exemplary Bluetooth® LE systems at a 1 Mbit/s data rate in accordance with an exemplary embodiment of the present disclosure.

In the packet 240, the preamble has been offset to +100 kHz while the rest of the packet has been offset to −100 kHz. Note that the frequency error is removed after the $9^{th}$ bit. This bit may be considered part of the Access Address or Sync Word but will be different from the last bit of the preamble, so it may be used for carrier frequency estimation Turning to FIG. 11, plots of packet error rate, expressed as a percentage, versus power, expressed in dBm, for exemplary Bluetooth® LE systems receiving on channel 19 at a 1 Mbit/s data rate are indicated generally by the reference numeral 600 in accordance with exemplary embodiments of the present disclosure. As illustrated here, a first embodiment output 619 of a receiver like 1800 but with its banked frequency estimator 1400 disabled, is compared to a second embodiment output 620 of the receiver 1 with its non-banked frequency estimator enabled, and to a third embodiment output 621 of the receiver 1800 with its banked frequency estimator 1400 fully enabled with all parallel correlator streams active. As shown, the comparative performance of embodiments of the present disclosure using a frequency estimator including banked correlators exhibits significantly lower error rate percentages, particularly for low power such as below about −80 dBm in at least this exemplary embodiment.

The plot 621 illustrates that the embodiment achieves a particularly clean curve for low SNR. That is, by enabling the frequency estimator with banked correlators, the receiver curves, such as in the plot 621, have optimized levels achieved versus the alternatives.

Figure 12:
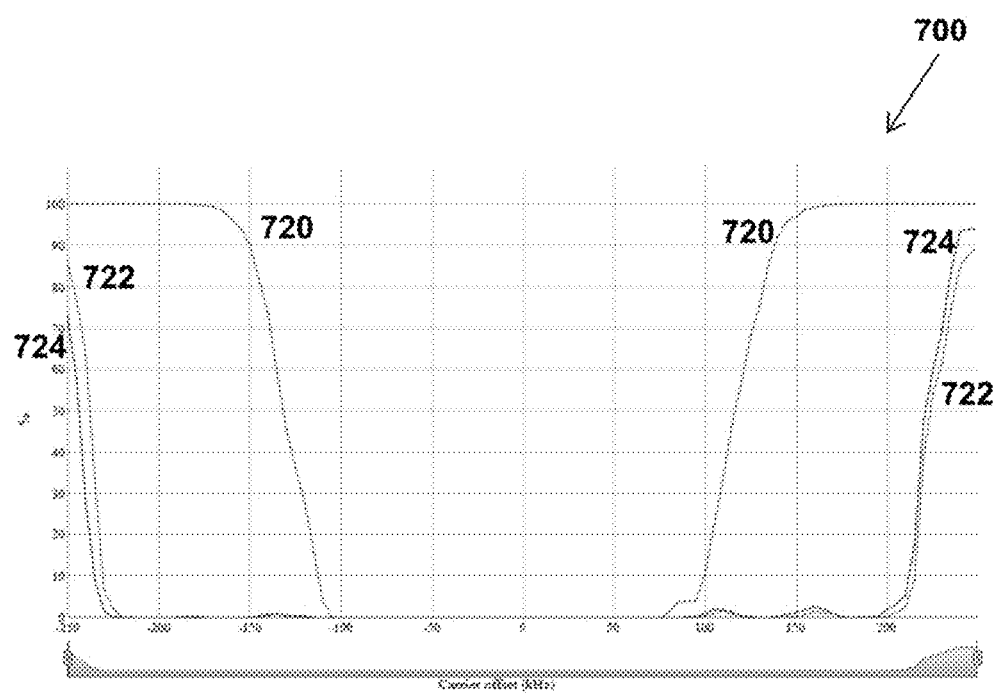
FIG. 12 is a graphical diagram illustrating percent error (PER) versus Carrier Frequency Offset plots for exemplary Bluetooth® LE systems at a 1 Mbit/s data rate in accordance with an exemplary embodiment of the present disclosure.

Turning now to FIG. 12, plots for Packet Error Rate (PER) percentage versus carrier frequency offset in exemplary Bluetooth® LE systems at a 1 Mbit/s data rate are indicated generally by the reference numeral 700, in accordance with exemplary embodiments of the present disclosure. Here, a first plot 720 illustrates signal results for the receiver 1 with non-banked frequency estimator using LE at 1 Mbit/s over Channel 19 at −70 dBm low signal power, a second plot 722 illustrates signal results for the receiver 400 with banked frequency estimator using LE at 1 Mbit/s over Channel 19 at −10 dBm high signal power, and a third plot 724 illustrates signal results for the receiver 400 with banked frequency estimator using LE at 1 Mbit/s over Channel 19 at −70 dBm low signal power.

Moreover, this exemplary embodiment has demonstrated a doubling of Bluetooth® LE 1 Mbit/s compensable frequency offset range from 110 kHz without the banked estimator in the plot 720 compared to 220 kHz with the banked estimators in the 722 and 724 plots. The plot 720 with limited capture range may be comparable to related art frequency estimators, while the extended capture range of the curves 722 and 724 utilize the banked correlator approach of this disclosure. In tests with Bluetooth® LE at 2 Mbit/s, compensable frequency offset has increased beyond 250 kHz exceeding the test equipment testing abilities. For IoT products, this extended capture range is highly desirable as some related art embodiments were otherwise sensitive to carrier frequency error. Thus, embodiments of the present disclosure may achieve relatively high capture range.

Figure 13:
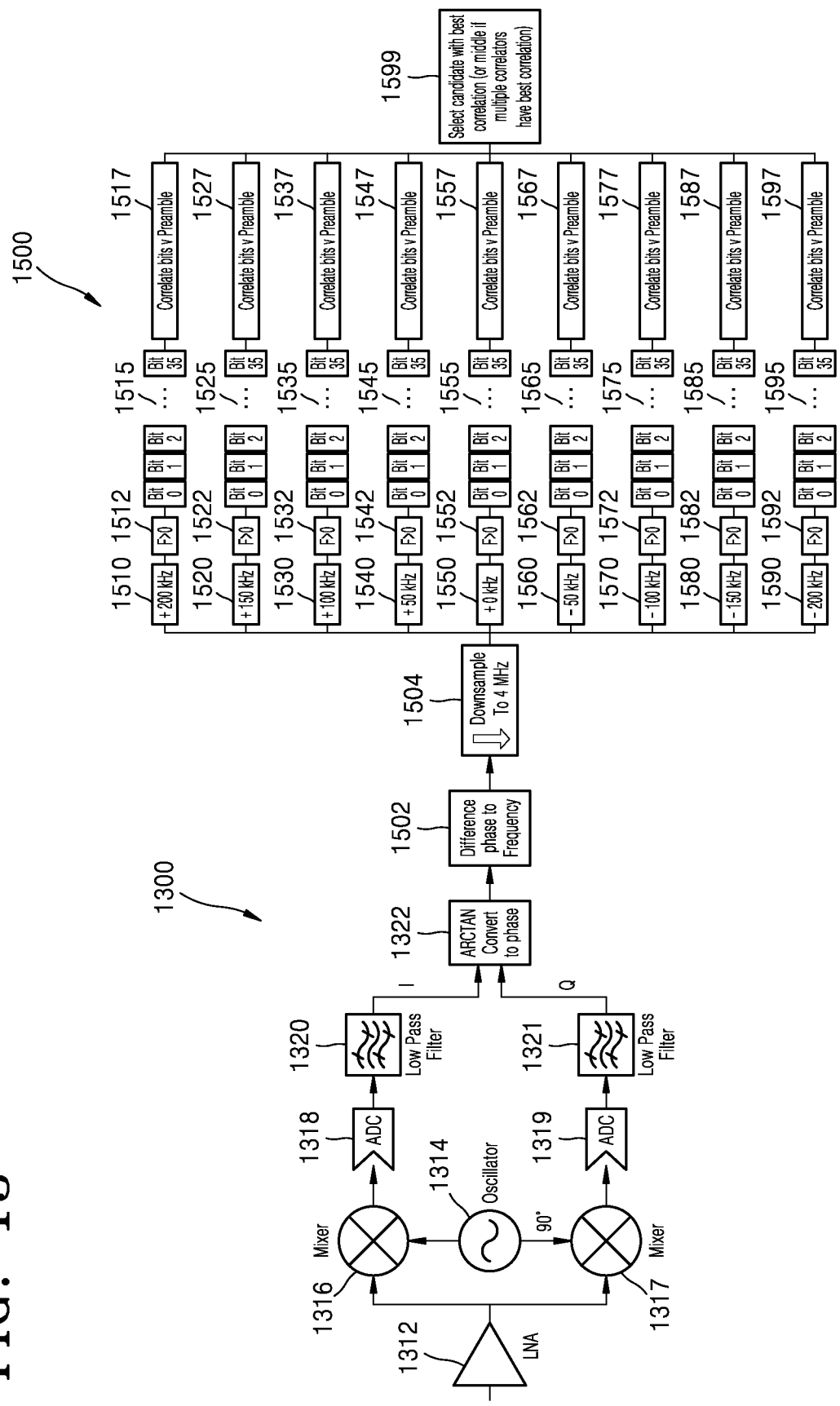
FIG. 13 is a schematic block diagram illustrating an In-phase Quadrature (I/Q) receiver including a carrier frequency error estimator at 4 times symbol rate for 9-bit preambles in accordance with an exemplary embodiment of the present disclosure.

As shown in FIG. 13, an In-phase Quadrature (I/Q) receiver including the carrier frequency error estimator 300 with banked correlators is indicated generally by the reference numeral 1300. The receiver 1300 includes a low-noise amplifier (LNA) 1312 connected to a first mixer 1316 and a second mixer 1317, an oscillator 1314 that provides a first signal to the first mixer 1316 and a second signal, 90 degrees out of phase with the first signal, to the second mixer 1317, a first analog-to-digital converter (ADC) 1318 connected to the first mixer, and a second ADC connected to the second mixer, a first low-pass filter 1320 connected to the first ADC and a second low-pass filter 1321 connected to the second ADC, an ARCTAN to phase converter 1322 connected to the first and second low-pass filters, a difference phase to frequency converter 1502 connected to the ARCTAN to phase converter 1322, a 4 MHz down-sampler 1504 connected to the difference phase to frequency converter, as well as the parallel correlators and selector of the estimator 1500 connected to the down-sampler 1504.

The carrier frequency error estimator 1500 includes a bank of parallel stream correlators, in accordance with an exemplary embodiment of the present disclosure. The estimator 1500 is similar to the estimator 300, so substantially duplicate description may be omitted. In the estimator 1500, the number of bits in each of the FIFO buffers (1515, 1525, 1535, 1545, 1555, 1565, 1575, 1585, and 1595) may be variable up to any positive integer N in bit length, rather than 9 bits for an LE Preamble and/or 5 bits for a BR/EDR Preamble, and may be any number sufficient to hold the reference, which shall include at least a portion of the preamble, and optionally a portion of the access address, CRC code or the like, or any combination thereof. The FIFO lengths of 36 bits may be varied and/or the enabled length may be actively controlled, such as for power-savings and/or responsive to environmental conditions that may tend to affect the SNR. Moreover, the correlators (1517, 1527, 1537, 1547, 1557, 1567, 1577, 1587, and 1597) may be configured to correlate the 36 bits with the reference, each four bits of oversampled signal from the FIFO corresponding to one bit of preamble and/or reference, such as the preamble and first dependent bit of the access address, sync word or preceding ECC code, and/or greater portions thereof, without limitation.

The receiver 1300 is capable of implementing the techniques of the present disclosure without unnecessary compromises in cost, size, or accuracy. This is a generic direct conversion receiver, although the present disclosure is not limited to that architecture. At the LNA, the exemplary signal is received in the 2.4-2.48 GHz industrial, scientific and medical (ISM) band. This signal is amplified and down-converted. The signal is then digitised and low-pass filtered by a filter wide enough (typically 1.3 MHz) to allow through the signal including any carrier frequency offset. It may be assumed that the received signal is mixed at the nominal channel frequency of the transmission. In practice, this might be achieved over two mixing process, such as a first mixing to an intermediate frequency (IF), and a second mixing to down-convert to a baseband frequency, which may potentially be performed in the digital domain. Thus, the right-hand side shows processing that is particularly pertinent to the disclosure.

Figure 14:
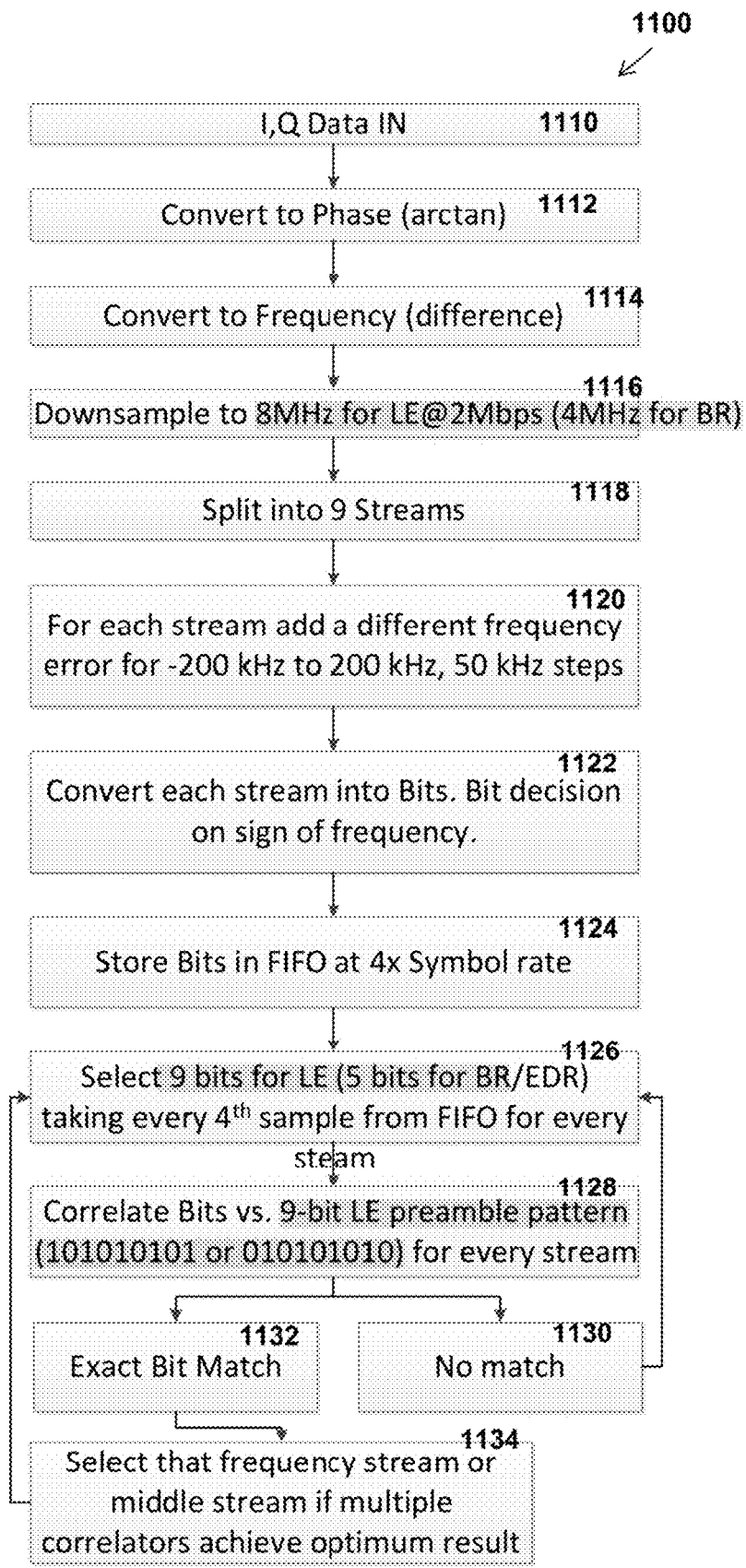
FIG. 14 is a flowchart diagram illustrating a method of frequency stream selection in accordance with the receiver of FIG. 13.

Turning to FIG. 14, an exemplary embodiment processing flow for a carrier frequency error estimation method is indicated generally by the reference numeral 1100. Here, function block 1110 receives in-phase (I) and quadrature (Q) valued input data (in-phase/quadrature or I,Q paired data), and passes control to function block 1112. Block 1112 converts the I,Q paired data into phase data by using an arctangent function, and passes control to function block 1114. Block 1114 converts to frequency data by using a difference function, and passes control to function block 1116. Block 1116 down-samples to 8 MHz for a Bluetooth® LE signal at a 2 Mbit/s data rate (or to 4 MHz for a Bluetooth® BR/EDR signal), without limitation thereto, and passes control to function block 1118. Block 1118, in turn, splits the signal into nine streams, and passes control to function block 1120.

Block 1120 adds a different potential frequency error to each stream, from −200 kHz to +200 kHz, in 50 kHz increments, and passes control to function block 1122. Block 1122 converts each stream into bits, by making a simple bit decision based on the sign of the frequency, and passes control to function block 1124. Block 1124 stores the bits in the FIFO buffer at four times (4×) the symbol rate, and passes control to function block 1126.

Block 1126, in turn, selects 9 bits for Bluetooth® LE (or 5 bits for Basic Rate), taking every fourth sample from the respective FIFO buffer for each stream, and passes control to function block 1128. Block 1128 correlates the bits against the Preamble, such as 101010101 or 010101010 for Bluetooth® LE (or 10101 or 01010 for Bluetooth® BR/EDR) for every stream. If no correlation exceeds the threshold, block 1128 passes control through block 1130 back to block 1126. If any correlation exceeds the threshold, block 1128 passes control through block 1132 on to function block 1134. Block 1134, in turn, selects that highest correlated frequency stream, or a middle stream if multiple correlators achieve an optimum result.

Thus, the I,Q paired data samples are converted to phase, and this phase is then differenced to give a frequency by FM demodulation. The demodulated data is down-sampled to four samples per symbol, although many other choices are possible. At this point, the processing becomes parallel as nine carrier frequency error candidates, without limitation thereto, are processed in parallel. For each of the nine streams, a different frequency error is added. In this embodiment, a granularity of 50 kHz is used, without limitation thereto, giving nine streams. Other choices are possible; such as more streams and a finer resolution or fewer streams at the expense of a coarser resolution, either of which may be used to reach performance objectives for a given application. Moreover, the granularity may be finer towards the nominal or center frequency. The FM demodulation is then converted into bits. This may be done by simply assigning a 1 bit if the frequency is greater than zero, or a 0 bit if the frequency is less than zero. This data is then buffered in a FIFO, which is compared against the Preamble or first 5 effective bits thereof.

The data in this embodiment is four times oversampled, so every fourth sample is compared against the Preamble. For Bluetooth® LE, such as at a 2 Mbit/s data rate, an exact match is sought with no bit errors. If one or more of the stream's correlators achieve this, then sync has been achieved. If multiple correlators show this result, then the middle correlator in terms of the carrier frequency error will be selected. In the case of an even number of correlators achieving the result, then the lowest carrier frequency offset of the middle pair is selected. Finally, the selected stream is also used to derive the symbol timings for use by the demodulator. The three aspects of synchronization are therefore achieved for the incoming packet, namely: 1) Preamble check, 2) carrier frequency estimation, and 3) symbol timing recovery.

The method may be adapted for Bluetooth® Classic (BR as well as EDR since EDR packets have a BR header). Bluetooth® BR/EDR has a shorter preamble of 5 effective bits, versus the 9 effective bits of Bluetooth® LE. The algorithm searches for a correlation with the fewest bit errors. Similarly, if an optimum result is achieved across multiple correlators, the middle such correlator is selected. In an embodiment, the first 4 bits of the sync word may be appended to the preamble to form the reference pattern.

In an embodiment, the number of bits per FIFO buffer may be reduced from 256, 128, 64, 36, 32, 20 or 16 to nine, five or four effective bits, for example. In an embodiment the number of streams may be reduced from nine to seven, five or three streams. In an embodiment with more than three streams, the granularity may be increased farther from the center stream.

Optimized performance may be achieved for varied design constraints by embodiments of the present disclosure. An alternate embodiment of the present disclosure may be embodied in a radio frequency (RF) die, such as a WiFi™/Bluetooth® combination system-on-chip (SoC) architecture, an Internet of Things (IoT) connectivity SoC, or the like.

The Access Address check of BLE is more sensitive than the Sync Word check of BR because every bit must match in the Access Address check of BLE, while the Sync Word of BR/EDR has a Hamming distance. Consequently, for BLE, the length of the correlation could be extended from 5 bits to 7 or 9 bits. While this may produce a more accurate estimate in some usage scenarios, AGC activity might make this choice less robust in others. Accordingly, 5 bits may be preferred for multi-mode Bluetooth® compatibility.

Figure 15:
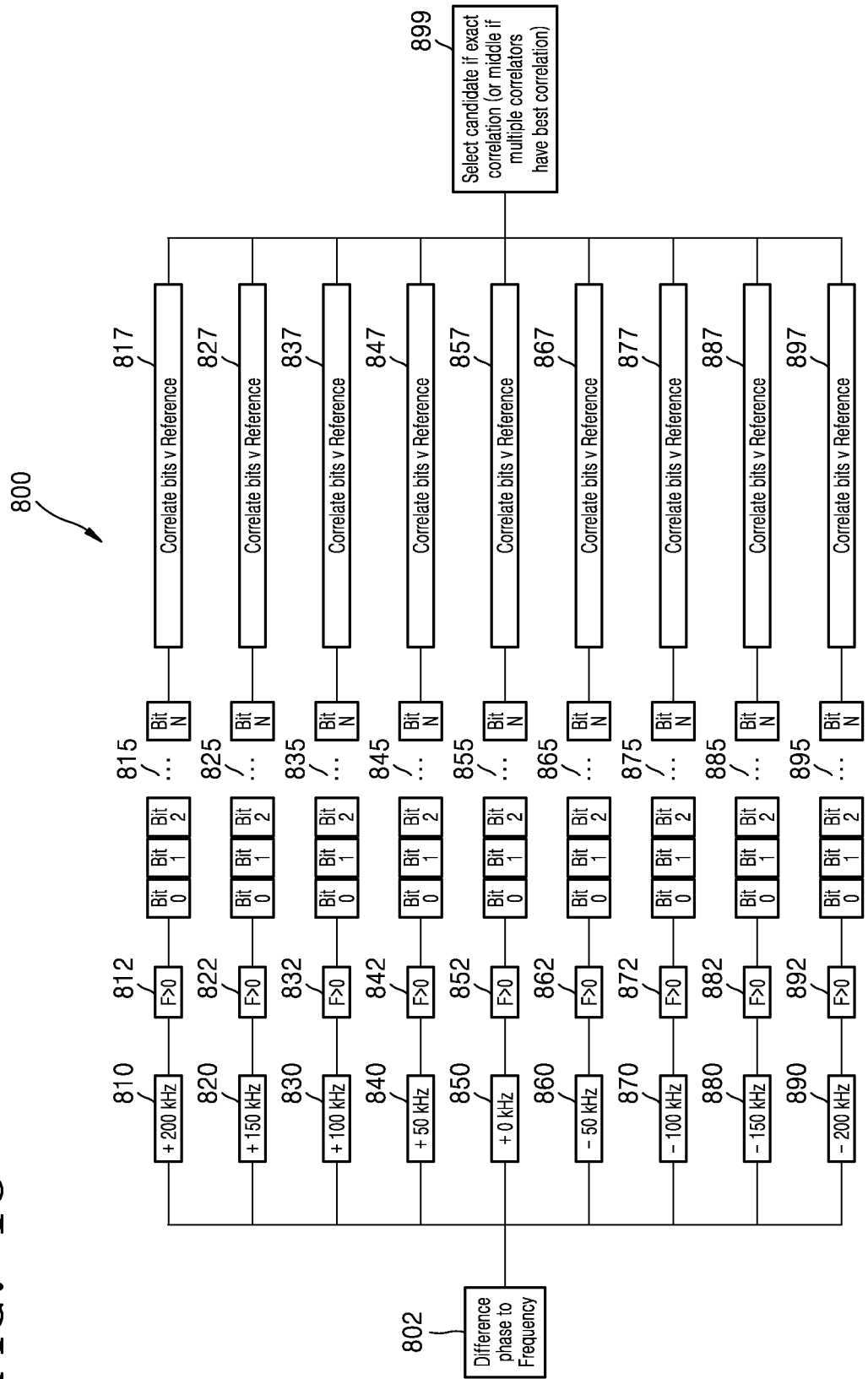
FIG. 15 is a schematic block diagram illustrating a carrier frequency error estimator including a bank of correlators in accordance with an exemplary embodiment of the present disclosure.

Turning now to FIG. 15, a carrier frequency error estimator including a bank of correlators is indicated generally by the reference numeral 800, in accordance with an exemplary embodiment of the present disclosure. The embodiment 800 is similar to the embodiment 300, so substantially duplicate description may be omitted. In the estimator 800, the number of bits in each of the FIFO buffers (815, 825, 835, 845, 855, 865, 875, 885, and 895) may be variable up to any positive integer N in bit length, rather than 9 bits for an LE Preamble and/or 5 bits for a BR/EDR Preamble, and may be any number sufficient to hold the reference, which shall include at least a portion of the preamble, and optionally a portion of the access address, CRC code or the like, or any combination thereof. The length variability may be actively controlled, such as for power-savings and/or responsive to environmental conditions that may tend to affect the SNR. Moreover, the correlators (817, 827, 837, 847, 857, 867, 877, 887, and 897) may be configured to correlate the N bits with the reference, such as the preamble and/or first dependent bit of the access address, sync word or code, and/or greater portions thereof, without limitation.

Figure 16:
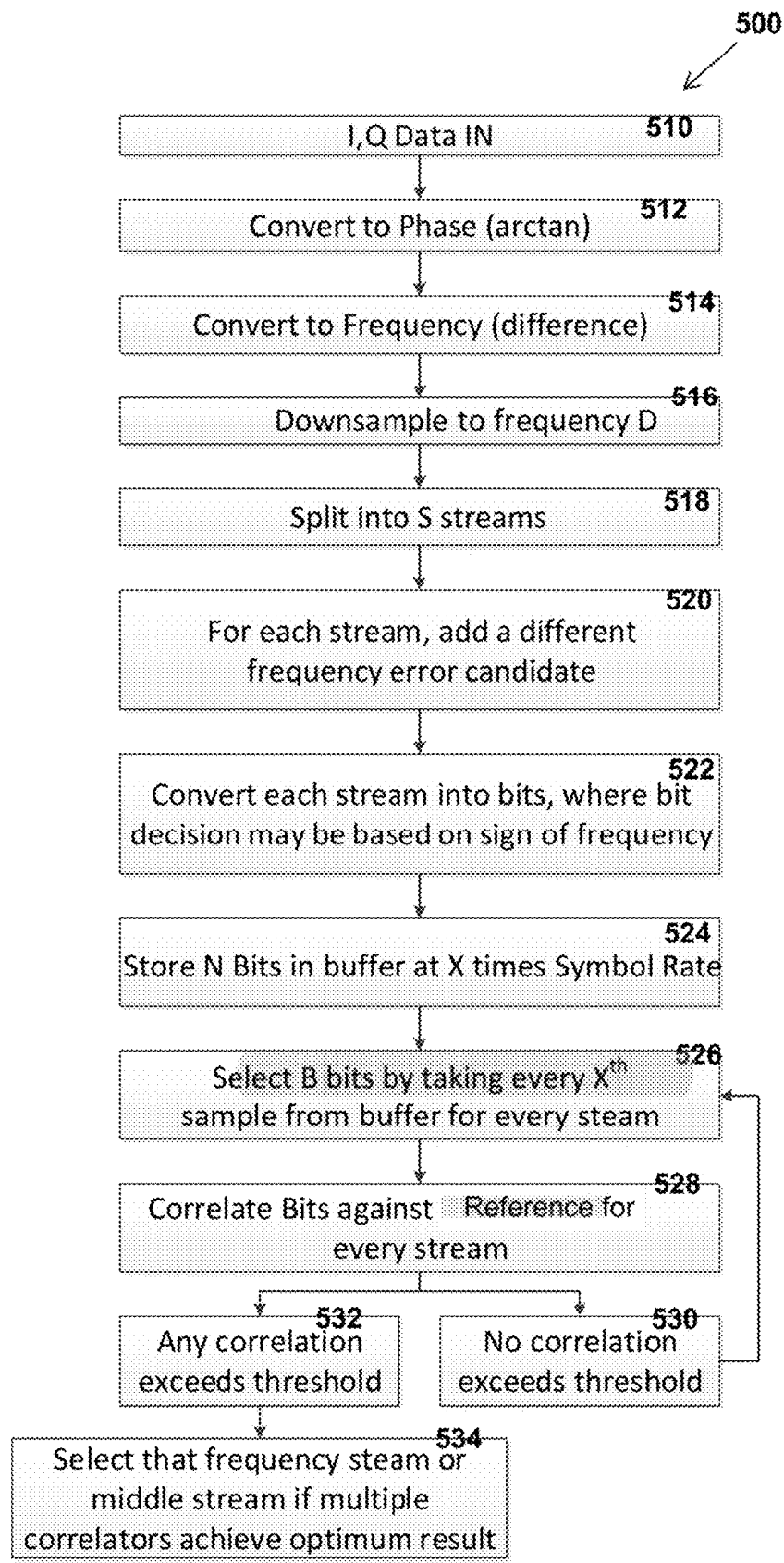
FIG. 16 is a flowchart diagram illustrating a method of frequency stream selection in accordance with the estimator of FIG. 15.

As shown in FIG. 16, an exemplary embodiment processing flow for a carrier frequency error estimation method is indicated generally by the reference numeral 500. Here, function block 510 receives in-phase (I) and quadrature (Q) valued input data (in-phase/quadrature or I,Q paired data), and passes control to function block 512. Block 512 converts the I,Q paired data into phase data by using an arctangent function, and passes control to function block 514. Block 514 converts to frequency data by using a difference function, and passes control to function block 516. Block 516 down-samples to any desired frequency D, such as but not limited to 8 MHz for a Bluetooth® LE signal at a 2 Mbit/s data rate, which is a multiple of Symbol rate, and passes control to function block 518. Block 518, in turn, splits the signal into a plurality S of parallel streams, and passes control to function block 520.

Block 520 adds a different potential frequency error to each stream, such as but not limited to −200 kHz to +200 kHz in 50 kHz increments, and passes control to function block 522. Block 522 converts each stream into bits, such as by making a simple bit decision based on the sign of the frequency, and passes control to function block 524. Block 524 stores a plurality N of the bits in the FIFO buffer at X times the symbol rate where X may be any non-zero rational number, and passes control to function block 526.

In alternate embodiments, the buffer need not be a FIFO buffer. In alternate embodiments, depending on the form of the Reference including at least a portion of the preamble, X may be any positive rational number, such as ½ to store every odd bit or every even bit to the buffer. For another example, X may be one.

Block 526, in turn, selects B bits, such as but not limited to the first five of the nine effective bits for a Bluetooth® LE preamble, by taking every $X^{th}$ sample from the respective FIFO buffer for each stream, and passes control to function block 528.

Block 528 correlates the B bits against the Reference, such as but not limited to 10101 or 01010 for any type of Bluetooth®, for every stream. If no correlation exceeds the threshold, block 528 passes control through block 530 back to block 526. If any correlation exceeds the threshold, block 528 passes control through block 532 on to function block 534. Block 534, in turn, selects that highest correlated frequency stream, or a middle of those streams if multiple correlators achieve an optimum result. In alternate embodiments, the lowest or highest frequency stream of those streams may be selected if multiple correlators achieve an optimum result.

Alternative embodiments may involve design trade-offs between complexity, power-savings, and/or accuracy in low SNR environments. The width of correlators may be reduced to as low as five bits as tested, or theoretically fewer bits, or could be extended up to the size of the Preamble plus the first bit of the Access Address or Sync Word for the pertinent communications protocol, without limitation thereto. The wider the correlators, the more robust the design to a point. In a minimal case, the correlators may be as small as five bits wide using just the first five bits of the Preamble as reference. In a maximal case, the correlator may be wide enough to span the Preamble plus a first dependent bit of the Access Address or Sync Word and potentially any Cyclic Redundancy Code (CRC) or the like. The reference for the correlators may be at least the first several bits of the Preamble, plus optionally a first dependent bit of the Access Address or Sync Word that is different from the last bit of the preamble, for example.

Another alternative embodiment may use a simple min/max detector or other estimator for the low carrier frequency errors and only switch to this method if the parallel correlations in response to an indication of a larger carrier frequency error, such as, for example, greater than 100 kHz, without limitation thereto. The advantage of this embodiment is that for substantially smaller carrier frequencies errors, an alternative estimator may be sufficiently accurate and/or conservative of power, but might otherwise encounter difficulties for larger carrier frequency errors.

Moreover, in a SoC combination package supporting two or more simultaneous communication channels and/or protocols, a single set of banked correlators may be applied to one or the other among the channels based on need and/or priority. For example, in a SoC supporting both Bluetooth® and WiFi™, the banked correlators might be alternately used for the channel suffering the greater carrier frequency offset and/or lower SNR, without limitation thereto. Moreover, in another embodiment, the banked correlators may be used as a single set with one frequency offset increment, or alternatively be temporarily divided into two sets using adaptive frequency offset increments for one or both of the two sets, without limitation thereto.

An alternate embodiment may be a combination of two or more of the embodiments discussed above. For example, a five-bit correlator on the preamble is made, but the results are only used if the carrier frequency error is large. Such choices may be made to meet varying design criteria and/or use scenarios, including but not limited to legacy compatibility and/or silicon area considerations.

As noted in the description of the present disclosure, other choices are possible for sample rate, number of correlators, and/or the frequency granularity of the correlators. Embodiments may be directed towards either or combinations of WiFi™, Bluetooth®, Zigbee, near-field-communications (NFC), cellular communications, and/or the like, may include additional steps for receiving and processing in-phase (I) and quadrature (Q) valued data, down-sampling such data, buffering multiple samples of such data, performing a Fast-Fourier Transform (FFT) or the like on such samples into multiple bins, calculating a square of the absolute values or other averaging means for the bins, summing sets of bins over multiple combinations to cover frequency errors, taking a maximal combination prior to comparison with a threshold, looping control back to an earlier point or performing optional steps depending on whether the threshold is crossed and in what direction, using FFT bin phases to extract symbol timing, and/or the like.

An exemplary embodiment receiver 400 including the carrier frequency error estimator 300 having a bank of correlators, may use a direct conversion receiver architecture capable of implementing the present disclosure, although the present disclosure is not limited to this type of architecture. For example, a super-heterodyne type of receiver or the like may be used in alternate embodiments. The signal may be received in the 2.4 GHz band, for example but without limitation thereto, which is then amplified, mixed, and sampled. The signal may be digitized and/or optionally low-pass filtered using a filter having sufficiently wide bandwidth to allow passage of the signal including any frequency offset prior to any down-sampling. Thus, the present disclosure is applicable to buffered data, optionally down-sampled in alternate embodiments.

It shall be understood that exemplary embodiments of the present disclosure may perform some or all of their tasks in one or more modules or submodules, where the estimation itself may reside entirely on the client, or be shared between the client and another client and/or access point. In another embodiment, the client estimates frequency information and forwards this to another client and/or access point so the estimation may be performed at the access point.

In contemplated embodiments, a client's estimator may perform any one or more of the following without limitation: 1) collecting and/or measuring the current signal information (including pre-amble and/or mid-amble when available), 2) estimating the current frequency error based on the information, 3) predicting potential near-term changes such as when there is relative motion between the transmitter and receiver, based on the current information and optionally based on prior information.

While exemplary embodiments have been described to operate in Bluetooth® environments, and a preferred embodiment has been described to operate under the Bluetooth® LE SIG standard, the present disclosure is not limited thereto. For example, alternate embodiments of the present disclosure may be configured to operate over any type of Bluetooth®, any type of WiFi™, any combination of Bluetooth® and WiFi™, and/or other wireless communications protocols, channels or environments.

Although exemplary embodiments of the present disclosure have been shown and described, it shall be understood that those of ordinary skill in the pertinent art may make changes therein without departing from the scope, principles, and spirit of the present disclosure as defined by the appended claims and their equivalents.

What is claimed is:

1. A carrier frequency estimator comprising:
   a frequency input terminal disposed to receive a frequency-domain input signal comprising a plurality of symbols;
   a plurality of candidate pipelines, each comprising a frequency adder coupled to the frequency input terminal, a bit converter coupled to the frequency adder, a multi-bit buffer coupled to the bit converter and configured to select a plurality of bits corresponding to at least one bit per symbol to match a number of bits in a reference code, and a correlator coupled to the multi-bit buffer and configured to correlate the selected plurality of bits with the reference code, respectively; and
   a candidate pipeline selector coupled to the correlators,
   wherein the selected plurality of bits is less than a converted plurality of bits from the bit converter, and the selected bits are non-consecutive.

2. The estimator of claim 1, wherein:
   each of the frequency adders has a predefined frequency offset relative to an adjacent adder.

3. The estimator of claim 1, wherein the plurality of candidate pipelines are arranged in parallel with each other.

4. The estimator of claim 1, wherein each of the multi-bit buffers is a first-in first-out (FIFO) buffer.

5. The estimator of claim 1, wherein each of the multi-bit buffers has a bit length greater than or equal to a positive integer divisor of at least one of a pre-amble, a mid-amble, or a communications code of the input signal.

6. The estimator of claim 1, wherein each of the correlators comprises a single-bit correlator that is configured to correlate a plurality of bits, corresponding to at least one bit per symbol, with at least five bits of a pre-amble derived from the input signal.

7. The estimator of claim 1, wherein the selector is configured to select one of the plurality of candidate pipelines having a greatest correlation.

8. A method of carrier frequency estimation comprising:
   receiving a frequency-domain input signal comprising a plurality of symbols;
   splitting the received frequency-domain input signal into a plurality of streams;
   adding a different candidate frequency error to each stream;
   converting each stream into a respective plurality of bits;
   storing the respective plurality of bits into a buffer at an integer multiple of a symbol rate of the plurality of symbols;
   selecting a plurality of bits corresponding to at least one bit per symbol from each buffer for each respective stream to match a number of bits in a reference code;
   correlating the selected plurality of bits of each stream with the reference code; and
   selecting one of the plurality of streams having the greatest correlation as a basis for the carrier frequency estimation, wherein the selected plurality of bits is less than the converted plurality of bits, and the selected bits are non-consecutive.

9. The method of claim 8, further comprising:
receiving in-phase/quadrature-valued input data;
converting the in-phase/quadrature-valued input data into phase data; and
converting the phase data into the frequency-domain input signal.

10. The method of claim 8, further comprising down-sampling the frequency-domain input signal.

11. The method of claim 8, wherein:
adding a different candidate frequency error to each stream comprises adding substantially evenly spaced candidate frequency errors to the respective streams.

12. The method of claim 8, wherein adding a different candidate frequency error to each stream comprises adding unevenly spaced candidate frequency errors to the respective streams based on a probability distribution of expected carrier frequency differences between a transmitter and a receiver.

13. The method of claim 8, wherein converting each stream into a respective plurality of bits comprises basing each bit decision on a sign of frequency.

14. The method of claim 8, wherein:
the buffer is a first-in first-out (FIFO) buffer storing four times the symbol rate; and
the selected plurality of bits from each buffer for each respective stream is at least five bits of a preamble derived from the input signal and one quarter of a number of bits buffered therein based on a mode of every four samples from the respective FIFO buffer for each respective stream.

15. A receiver comprising:
an input terminal configured to receive an input signal comprising a plurality of frequency-modulated data packets defining a plurality of symbols for a first channel;
an oscillator;
a first mixer connected to the input terminal and a first output of the oscillator;
a first analog-to-digital converter (ADC) connected to the mixer;
a second mixer connected to the input terminal and a second output of oscillator, wherein the second output is in quadrature with the first output of the oscillator;
a second ADC connected to the second mixer;
an in-phase/quadrature to phase converter connected to the first ADC and the second ADC;
a phase to frequency converter connected to the in-phase/quadrature to phase converter;
a plurality of candidate pipelines, each comprising a frequency adder coupled to the phase to frequency converter, a bit converter coupled to the frequency adder, a multi-bit buffer coupled to the bit converter and configured to select a plurality of bits corresponding to at least one bit per symbol to match a number of bits in a reference code; and a correlator coupled to the multi-bit buffer and configured to correlate the selected plurality of bits with the reference code, respectively; and
a candidate pipeline selector coupled to the correlators,
wherein the multi-bit buffer stores a plurality of preamble bits derived from the input signal,
wherein the selected plurality of bits is less than the stored plurality of bits, and the selected bits are non-consecutive.

16. The receiver of claim 15, further comprising an amplifier connected between the input terminal and the mixers.

17. The receiver of claim 15, further comprising:
a first filter connected between the first ADC and the in-phase/quadrature to phase converter; and
a second filter connected between the second ADC and the in-phase/quadrature to phase converter.

18. The receiver of claim 15, further comprising a down-sampler connected between the phase to frequency converter and the plurality of candidate pipelines.

19. The receiver of claim 15, wherein:
the plurality of candidate pipelines are arranged in parallel with each other.

20. The receiver of claim 15, further comprising a multiplexer and/or demultiplexer (Mux/Demux) connected between the phase to frequency converter and an input terminal of the plurality of candidate pipelines, wherein the Mux/Demux is configured to switchably share at least some of the plurality of candidate pipelines with another channel, and/or to temporarily bypass at least some of the plurality of candidate pipelines for the first channel.

* * * * *